United States Patent
Breitwisch et al.

(10) Patent No.: US 8,233,317 B2
(45) Date of Patent: Jul. 31, 2012

(54) PHASE CHANGE MEMORY DEVICE SUITABLE FOR HIGH TEMPERATURE OPERATION

(75) Inventors: Matthew J. Breitwisch, Yorktown Heights, NY (US); Chung H. Lam, Yorktown Heights, NY (US); Bipin Rajendran, Yorktown Heights, NY (US); Simone Raoux, San Jose, CA (US); Alejandro G. Schrott, Yorktown Heights, NY (US); Daniel Krebs, Aachen (DE)

(73) Assignee: International Business Machines Corporation, Armonk, NY (US)

( * ) Notice: Subject to any disclaimer, the term of this patent is extended or adjusted under 35 U.S.C. 154(b) by 81 days.

(21) Appl. No.: 12/619,362

(22) Filed: Nov. 16, 2009

(65) Prior Publication Data
US 2011/0116307 A1 May 19, 2011

(51) Int. Cl.
*G11C 11/00* (2006.01)
*H01L 47/00* (2006.01)
(52) U.S. Cl. ........... 365/163; 365/148; 257/2; 257/4
(58) Field of Classification Search ............ 365/163
See application file for complete search history.

(56) References Cited

U.S. PATENT DOCUMENTS

| | | | |
|---|---|---|---|
| 5,118,299 A | 6/1992 | Burns et al. | |
| 5,687,112 A | 11/1997 | Ovshinsky | |
| 5,789,277 A | 8/1998 | Zahorik et al. | |
| 5,825,046 A * | 10/1998 | Czubatyj et al. | 257/2 |
| 5,903,059 A | 5/1999 | Bertin et al. | |
| 5,956,575 A | 9/1999 | Bertin et al. | |
| 6,087,674 A * | 7/2000 | Ovshinsky et al. | 257/2 |
| 6,150,253 A | 11/2000 | Doan et al. | |
| 6,393,685 B1 | 5/2002 | Collins | |
| 6,512,241 B1 | 1/2003 | Lai | |
| 6,744,088 B1 | 6/2004 | Dennison | |
| 6,750,469 B2 * | 6/2004 | Ichihara et al. | 257/2 |
| 6,791,102 B2 | 9/2004 | Johnson et al. | |
| 7,026,213 B1 | 4/2006 | Lee | |
| 7,057,923 B2 | 6/2006 | Furkay et al. | |
| 7,324,365 B2 | 1/2008 | Gruening-von Schwerin et al. | |
| 7,362,608 B2 | 4/2008 | Schwerin et al. | |
| 7,394,088 B2 | 7/2008 | Lung | |

(Continued)

FOREIGN PATENT DOCUMENTS
WO 2009115995 A1 9/2009
(Continued)

OTHER PUBLICATIONS
Y.C. Chen et al.; "Ultra-Thin Phase-Change Bridge Memory Device Using GeSb;" Electron Device Meeting 2006; pp. 1-3.
(Continued)

*Primary Examiner* — Son Mai
(74) *Attorney, Agent, or Firm* — Cantor Colburn LLP; Vazken Alexanian

(57) ABSTRACT

A phase change memory cell that includes a bottom electrode, a top electrode separated from the bottom electrode, and growth-dominated phase change material deposited between the bottom electrode and the top electrode and contacting the bottom electrode and the top electrode and surrounded by insulation material at sidewalls thereof. The phase change memory cell in a reset state only includes an amorphous phase of the growth-dominated phase change material within an active volume of the phase change memory cell.

19 Claims, 4 Drawing Sheets

U.S. PATENT DOCUMENTS

| | | | |
|---|---|---|---|
| 7,397,060 | B2 | 7/2008 | Lung |
| 7,547,913 | B2 * | 6/2009 | Yoon et al. .................. 257/42 |
| 7,879,645 | B2 | 2/2011 | Lung et al. |
| 7,927,911 | B2 | 4/2011 | Breitwisch et al. |
| 8,012,790 | B2 | 9/2011 | Breitwisch et al. |
| 8,030,130 | B2 | 10/2011 | Breitwisch et al. |
| 2001/0032702 | A1 | 10/2001 | Feldman et al. |
| 2002/0023581 | A1 | 2/2002 | Vodakov et al. |
| 2004/0077123 | A1 | 4/2004 | Lee et al. |
| 2004/0179394 | A1 | 9/2004 | Ovshinsky et al. |
| 2004/0195604 | A1 | 10/2004 | Hwang et al. |
| 2005/0180191 | A1 | 8/2005 | Xu |
| 2005/0263829 | A1 | 12/2005 | Song et al. |
| 2006/0175597 | A1 | 8/2006 | Happ |
| 2007/0010082 | A1 | 1/2007 | Pinnow et al. |
| 2007/0018202 | A1 | 1/2007 | Zhu |
| 2007/0029606 | A1 | 2/2007 | Noh et al. |
| 2007/0034849 | A1 | 2/2007 | Sandoval et al. |
| 2007/0108488 | A1 | 5/2007 | Suh et al. |
| 2007/0155117 | A1 | 7/2007 | Wicker |
| 2007/0158395 | A1 | 7/2007 | Fasano et al. |
| 2007/0166981 | A1 | 7/2007 | Furukawa et al. |
| 2007/0184233 | A1 | 8/2007 | Meinders et al. |
| 2007/0246440 | A1 | 10/2007 | Sato |
| 2007/0246782 | A1 * | 10/2007 | Philipp et al. .................. 257/379 |
| 2007/0249086 | A1 | 10/2007 | Philipp et al. |
| 2007/0252127 | A1 | 11/2007 | Arnold et al. |
| 2008/0023685 | A1 | 1/2008 | Czubatyj et al. |
| 2008/0137400 | A1 | 6/2008 | Chen et al. |
| 2008/0138931 | A1 | 6/2008 | Lung |
| 2008/0164452 | A1 | 7/2008 | Joseph et al. |
| 2008/0178436 | A1 | 7/2008 | Zhang et al. |
| 2008/0191187 | A1 | 8/2008 | Lung et al. |
| 2008/0286446 | A1 | 11/2008 | Kamepalli et al. |
| 2008/0316794 | A1 | 12/2008 | Philipp et al. |
| 2009/0149006 | A1 | 6/2009 | Kim |
| 2009/0196094 | A1 | 8/2009 | Breitwisch et al. |

FOREIGN PATENT DOCUMENTS

| | | |
|---|---|---|
| WO | WO2009115995 A1 | 9/2009 |

OTHER PUBLICATIONS

Notification of Transmittal of the International Search Report (ISR) and the Written Opinion of the International Searching Authority, or the Declaration; date of mailing Jan. 10, 2011; PCT/US2010/056174.

Written Opinion of the International Searching Authority (PCT); date of mailing Jan. 10, 2011; PCT/US2010/056174.

Der-Sheng Chao et al., "Low Programming Current Phase Change Memory Cell with Double GST Thermally Confined Structure," VLSI Technology, 2006, Systems and Applications, 2007, VLSI-TSA 2007, International Symposium on; 23-5 Apr. 2007 pp. 1-2.

International Search Report—Written Opinion—International Application No.: PCT/US10/43631; International Filing Date: Jul. 29, 2010; Date of Mailing: Sep. 23, 2010.

M. Breitwisch et al., "Novel Lithography-Independent Pore Phase Change Memory," IEEE Symposium on VLSI Technology, 2007.

B. Rajendran et al., "On the Dynamic Resistance and Reliability of Phase Change Memory," Symposium on VLSI Technology; 2008.

S. Raoux et al., "Phase-change random access memory: A scalable technology", IBM J Res. & Dev. vol. 52. 4/5 Jul./Sep., 2008 pp. 465-479.

International Search Report; International Application No. PCT/US10/43631; International Filing Date: Jul. 29, 2010; Date of Mailing: Sep. 23, 2010.

Song, Y.J. et al., "Advanced ring type contact technology for high density phase chane menory," Solid-State Device Research Conference, 2005, ESSDERC 2005, Proceedings of 35th European; Sep. 12-16, 2005 pp. 513-516.

Song, Y.J. et al., "Highly Reliable 256Mb PRAM with Advanced Ring Contact Technology and Novel Encapsulating Technology", VLSI Technology, 2006, Digest of Technical Paper, 2006 Symposium on; pp. 118-119.

Xiu-Lan Cheng et al., "Simulation on a Novel Ga-doped Phase Change Memory for Next Generation Embedded Non-Volatile Memory Application," 2008 IEEE/SEMI Advanced Semiconductor Manufacturing Conference, pp. 43-48.

* cited by examiner

PHASE CHANGE MEMORY DEVICE SUITABLE FOR HIGH TEMPERATURE OPERATION

BACKGROUND

The present invention relates generally to phase change memory cells, and more specifically, to phase change memory cells suitable for high temperature operation.

Phase change material has a variety of applications in microelectronic devices such as optical storage media and solid state phase change memory devices. Phase change random access memory (PRAM) devices, for example, store data using a phase change material, such as, for example, a chalcogenide alloy, that transforms into a crystalline state or an amorphous state during cooling after a heat treatment. Each state of the phase change material has different resistance characteristics. Specifically, the phase change material in the crystalline state has low resistance and the phase change material in the amorphous state has high resistance. The crystalline state is typically referred to as a "set state" having a logic level "0", and the amorphous state is typically referred to as a "reset state" having a logic level "1". A current passed through the phase change material creates ohmic heating and causes the phase change material to melt. Melting and gradually cooling down the phase change material allows time for the phase change material to form the crystalline state. Melting and abruptly cooling the phase change material quenches the phase change material into the amorphous state. High resistance values are likely to change at high temperatures due to crystallization. Material with high crystallization temperature is more suitable for higher temperature operation. However, once quenched, the crystallization temperature decreases and the amorphous region is surrounded by a crystalline layer which acts as a seed for growth as shown in FIG. 1, for example.

FIG. 1 is a diagram illustrating a pillar phase change memory cell operating in the reset state at nominal operating conditions. As shown in FIG. 1, a pillar phase change memory cell 100 includes a bottom electrode 102, a pillar 104 filled with phase change material, and a top electrode 106. The bottom electrode 102 is formed on a conductive contact 108. Insulation material 110 and 111 surrounds the bottom electrode 102, the pillar 104, the top electrode 106 and the conductive contact 108. As shown in FIG. 1, after the reset operation is performed, a crystalline region 104a remains and surrounds an amorphous region 104b and acts as a seed for nucleation and crystal growth. Thus, if the phase change memory cell 100 is raised to a higher temperature, the data stored within the memory cell 100 may be lost or degraded due to changes in the size and shape of the amorphous region 104b.

SUMMARY

The present invention provides a phase change memory cell including growth-dominated phase change material and operated at over-reset condition to obtain superior data retention qualities at high temperatures (i.e., temperatures above approximately 150 degrees Celsius).

According to an embodiment of the present invention, a phase change memory cell is provided. The phase change memory cell that includes a bottom electrode, a top electrode separated from the bottom electrode, and growth-dominated phase change material deposited between the bottom electrode and the top electrode and contacting the bottom electrode and the top electrode and surrounded by insulation material at sidewalls thereof. In a reset state, the phase change memory cell only includes an amorphous phase of the growth-dominated phase change material within an active volume of the phase change memory cell. That is, according to an embodiment of the present invention, the active volume of the phase change memory cell does not include any polycrystalline phase of the growth-dominated phase change material.

According to another embodiment of the present invention, a method for operating a phase change memory cell is provided. The method includes supplying reset current at a predetermined value above a nominal reset condition to growth-dominated phase change material formed between a bottom electrode and a top electrode and surrounded by insulation material at sidewalls thereof, wherein an active volume in the phase change memory cell only includes an amorphous phase of the growth-dominated phase change material in a reset state.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
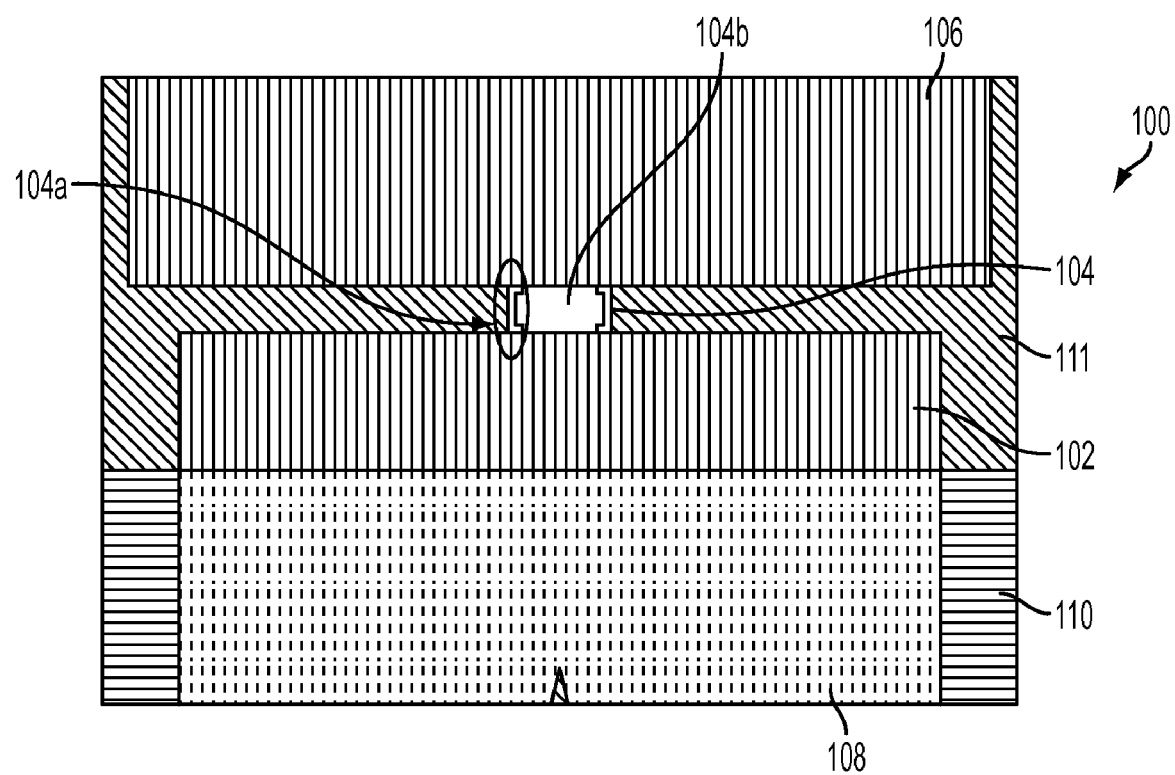
FIG. 1 is a diagram illustrating a conventional phase change memory cell.
Figure 2:
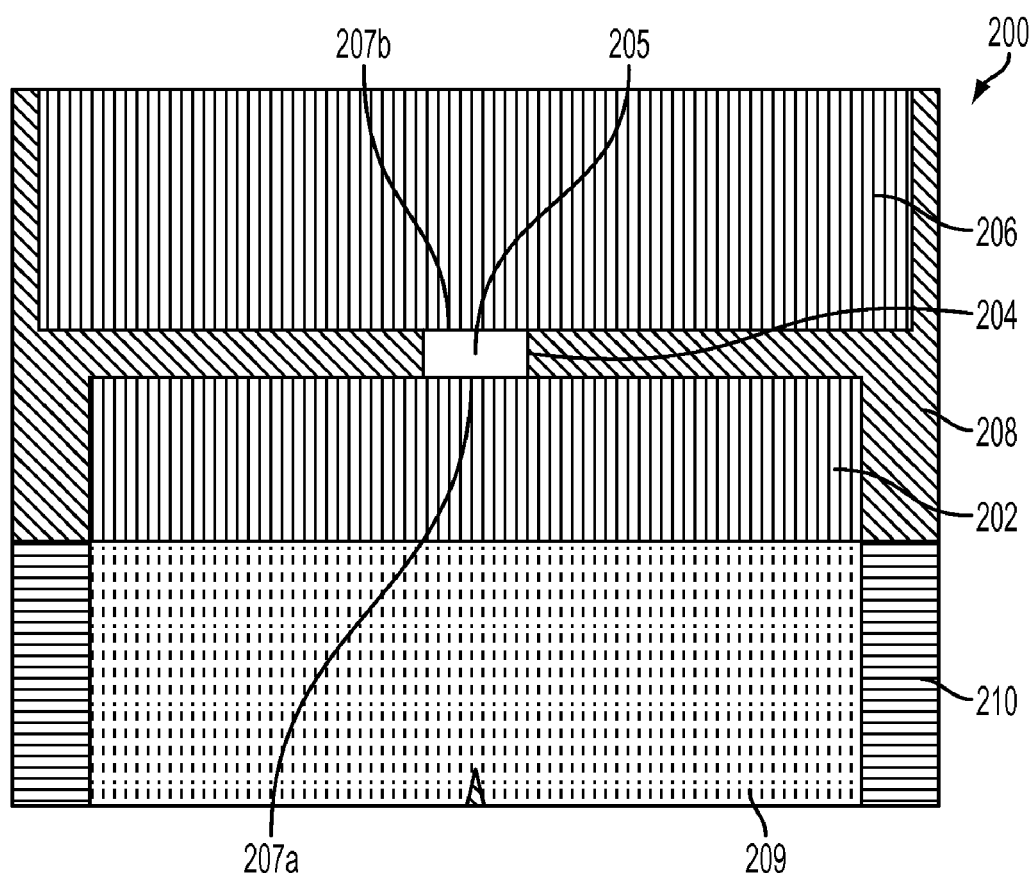
FIG. 2 is a diagram illustrating a phase change memory cell that can be implemented within embodiments of the present invention.

With reference now to FIG. 2, a phase change memory cell 200 is provided according to an embodiment of the present invention. According to an embodiment of the present invention, the phase change memory cell 200 is a pillar phase change memory cell. The present invention is not limited to a pillar phase change memory cell and may vary accordingly. In an alternate embodiment of the present invention, the phase change memory cell may be a phase change bridge memory cell as depicted in FIG. 4D.

The phase change memory cell 200 includes a bottom electrode 202, a pillar 204 and a top electrode 206 separated from the bottom electrode 202. The pillar 204 is filled with phase change material 205 and stores one or more bits of data. The phase change material 205 may be deposited by chemical vapor deposition (CVD) or atomic layer deposition (ALD) or any other suitable deposition technique. The diameter of the pillar 204 filled with the phase change material 205 is in the range of approximately 5 nanometers (nm) to 500 nanometers (nm). Further, according to an embodiment of the present invention, the aspect ratio of the pillar 204 is in the range of approximately 0.5 to approximately 10.

The bottom electrode 202 contacts the pillar 204 and the pillar 204 contacts the top electrode 206. Insulation material 208 laterally encloses the bottom electrode 202, the top electrode 206, and the growth-dominated phase change material 205 at sidewalls thereof. The insulation material 208 may include any suitable insulation material, such as silicon dioxide ($SiO_2$), silicon oxide ($SiO_x$), silicon nitride (SiN), fluorinated silica glass (FSG), boro-phosphorous silicate glass (BPSG), boro-silicate glass (BSG), or low-k material. According to an embodiment of the present invention, the bottom electrode 202 and top electrode 206 may be formed of any suitable electrode material, such as titanium nitride (TiN), tantalum nitride (TaN), tungsten (W), aluminum (Al), titanium silicon nitride (TiSiN), titanium aluminum nitride (TiAlN), tantalum silicon nitride (TaSiN), tantalum aluminum nitride (TaAlN), tungsten nitride (WN), or copper (Cu). The electrodes 202 and 206 may be formed by depositing electrode material by CVD or ALD, for example.

According to an embodiment of the present invention, the phase change material 205 may be formed of growth-dominated phase change material including an alloy including at least two materials of a group of materials containing germanium (Ge), antimony (Sb), tellurium (Te), indium (In), selenium (Se), bismuth (Bi), silver (Ag), gallium (Ga), tin (Sn), lead (Pb), and arsenic (As). According to an embodiment of the present invention, the growth-dominated phase change materials 205 are materials having a slower nucleation rate compared to nucleation-dominated materials. The use of such a growth-dominated phase change material 205 within the pillar 204 ensures that the amorphous state does not undergo phase transition to the poly-crystalline phase because of the absence of any nucleation seeds in the vicinity of the critical region.

As further shown in FIG. 2, the bottom electrode 202 is formed on a conductive contact 209 formed within insulation material 210. The conductive contact 209 may be formed of tungsten (W), for example. The conductive contact 209 contacts access circuitry such as an access transistor or diode and is electrically coupled to the bottom electrode 202 to control the application of current or voltage pulses to the top electrode 206 or vice versa and to the pillar 204, to set and reset the phase change material 205. The current flows along a current path through phase change memory cell 200. The current path includes the interface regions 207a and 207b between the bottom electrode 202, the pillar 204 and the top electrode 206. During operation of phase change memory cell 200, current or voltage pulses are applied between bottom electrode 202 and the top electrode 206 to program phase change memory cell 200.

According to an embodiment of the present invention, during a "set" operation of the phase change memory cell 200, a set current or voltage pulse is selectively enabled to the bottom electrode 202 and travels through the pillar 204 thereby heating the phase change material 205 above its crystallization temperature and below its melting temperature. Therefore, the phase change material 205 reaches a crystalline state or a partially crystalline and partially amorphous state during the "set" operation.

According to an embodiment of the present invention, during a "reset" operation of phase change memory cell 200, a reset current or voltage pulse is selectively enabled to the bottom electrode 202 and travels through the pillar 204. The reset current or voltage quickly heats the phase change material 205 above its melting temperature. After the current or voltage pulse is turned off, the phase change material quickly quench cools into a fully amorphous state. According to an embodiment of the present invention, the phase change memory cell 200 is operated at a current and power over nominal reset conditions in order to remove any crystallization region in the critical current path. For example, the phase change memory cell 200 may be operated at a reset current above the nominal conditions such that the entire phase change material 205 is converted into an amorphous state for programming the high resistance region. In one embodiment of the present invention, if the amount of current needed to achieve nominal reset conditions is $I_{reset}$, then the current used for programming the cell 200 for high temperature operation may be approximately 1.10 $I_{reset}$ or higher.

According to another embodiment of the present invention, the interface regions 207a and 207b between the phase change material 205 within the pillar 204 and the bottom electrode 202 and the top electrode 206 may be further modified to decrease the nucleation rate by incorporating atoms such as gallium (Ga) atoms.

Figure 3A:
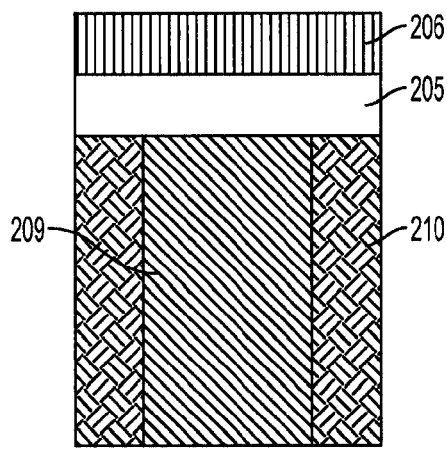
FIGS. 3A through 3D are diagrams illustrating a fabrication method for fabricating a phase change memory cell that can be implemented within embodiments of the present invention.
Figure 3B:
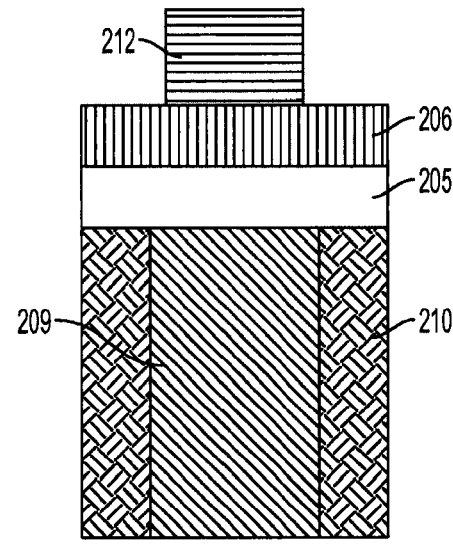
Figure 3C:
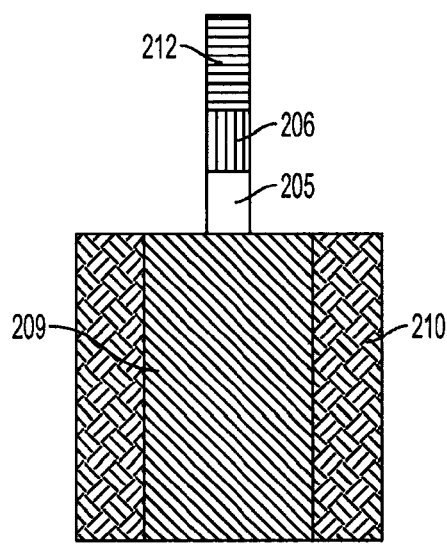
Figure 3D:
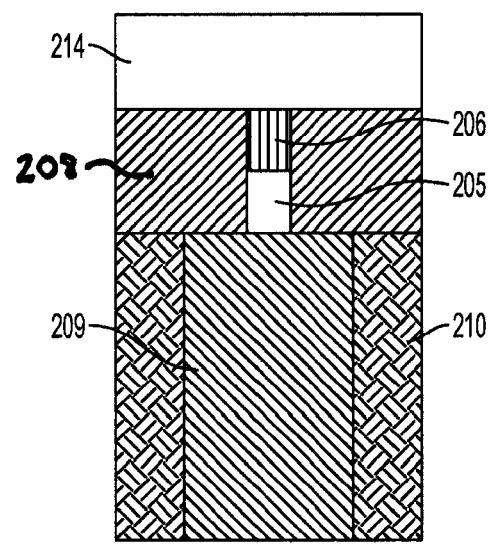

FIGS. 3A through 3D are diagrams illustrating a fabrication method for fabricating a phase change memory cell that can be implemented within embodiments of the present invention. The phase change memory cell fabricated within FIGS. 3A through 3D is a "pillar" phase change memory cell according to an embodiment of the present invention. As shown in FIG. 3A, phase change material 205 such as GST is deposited via a physical vapor deposition (PVD) process onto the conductive contact 209. Next, a material such as titanium nitride (TiN) for forming a top electrode 206 is deposited on the phase change material 205. As shown in FIG. 3B, a photo resist layer 212 is deposited and patterned into islands using conventional photolithography tools above the top electrode 206. In FIG. 3C, the photo resist layer 212 is trimmed and transferred down using a reactive ion etching (RIE) operation to make pillars of TIN/GST. Next, in FIG. 3D, the pillar 204 formed of the phase change material 205 and the top electrode 206 is encapsulated by the insulating material 208 and planarized via a chemical mechanical polishing (CMP) process to expose the top of the TiN pillar 204, to form copper (Cu) bit line wiring 214.

Figure 4A:
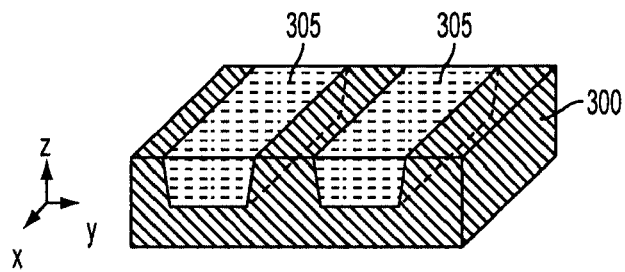
FIGS. 4A through 4D are diagrams illustrating a fabrication method for fabricating a phase change bridge (PCB) memory cell that can be implemented within alternative embodiments of the present invention.
Figure 4B:
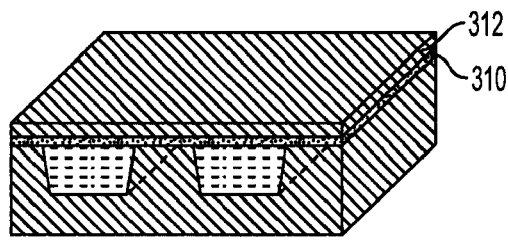
Figure 4C:
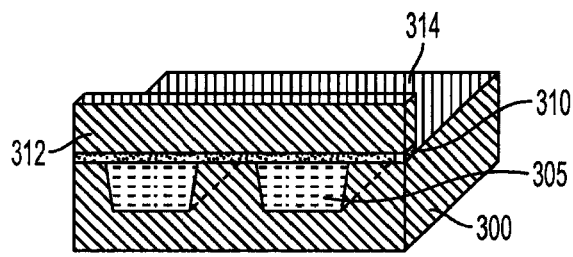
Figure 4D:
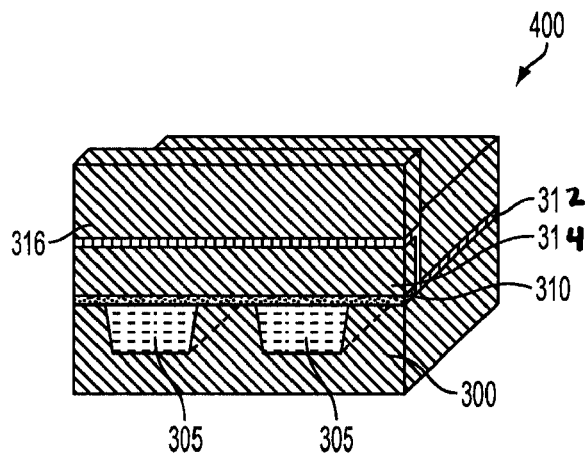

FIGS. 4A through 4D are diagrams illustrating a phase change bridge (PCB) memory cell that can be implemented within alternative embodiments of the present invention. As shown in FIG. 4A, two parallel trenches are formed within a dielectric layer 300 of silicon dioxide by conventional lithography and etching operations. The trenches are filled within a thick layer of titanium/titanium nitride by a sputter deposition and subsequent CMP, to form a plurality of bottom electrode 305 formed of titanium nitride separated by a small silicon dioxide gap. Next, in FIG. 4B, a growth dominated phase change material 310 formed of a thickness ranging from approximately 3 nanometers (nm) to approximately 100 nanometers (nm) is then deposited using magnetron sputtering, immediately followed by a cap dielectric layer 312 of silicon dioxide, to prevent oxidation of the phase change material 310. In FIG. 4c, E-beam lithography or nano-imprint lithography is then used to form bridge structures with widths ranging between 20 nanometers (nm) to approximately 200 nanometers (nm). Then, as shown in FIG. 4d, after a final ion milling operation, another cap dielectric layer 314 of approximately 5 nanometers (nm) to approximately 10 nanometers (nm) of a passivating material such as $Al_2O_3$ is deposited without breaking vacuum, to prevent oxidation. Next, another cap layer 316 of approximately 50 nanometers (nm) in thickness of silicon dioxide, for example, may be deposited before wiring the device to access circuitry. As a result of the fabrication operations shown in FIGS. 4A through 4D, a phase change bridge (PCB) memory cell 400 is formed.

An embodiment of the present invention provides a phase change memory cell including growth-dominated phase change material and operating at a current over a reset condition. Therefore, the phase change memory cell provides superior data retention qualities at high temperatures above approximately 150 degrees Celsius.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A phase change memory cell comprising:
a bottom electrode;
a top electrode separated from the bottom electrode;
growth-dominated phase change material deposited between the bottom electrode and the top electrode and contacting the bottom electrode and the top electrode and surrounded by insulation material at sidewalls thereof, wherein the phase change memory cell in a reset state only includes an amorphous phase of the growth-dominated phase change material within an active volume of the phase change memory cell, and wherein the phase change memory cell comprises a current path that includes interface regions between the bottom electrode, the growth-dominated phase change material and the top electrode such that a reset current at a predetermined value above the nominal reset condition flows along the current path, and the growth-dominated phase change material is fully amorphized after the reset operation, and wherein the interface regions comprise gallium (Ga) atoms.

2. The phase change memory cell of claim 1, wherein the phase change memory cell is a pillar phase change memory cell.

3. The phase change memory cell of claim 1, wherein the growth-dominated phase change material comprises an alloy including at least two materials of a group of materials containing Ge, Sb, Te, In, Se, Bi, Ag, Ga, Sn, Pb, As.

4. The phase change memory cell of claim 1, wherein the insulation material laterally encloses the bottom electrode, the top electrode, and the growth-dominated phase change material.

5. The phase change memory cell of claim 4, wherein the insulation material is silicon nitride.

6. The phase change memory cell of claim 4, wherein the bottom electrode and the top electrode are formed of titanium nitride (TiN).

7. The phase change memory cell of claim 1, wherein the phase change memory cell operates at a temperature above approximately 150 degrees Celsius.

8. The phase change memory cell of claim 2, wherein a diameter of the pillar filled with the growth-dominated phase change material is in a range of approximately 5 nanometers (nm) to approximately 500 nanometers (nm).

9. The phase change memory cell of claim 2, wherein an aspect ratio of the pillar is in a range of approximately 0.5 to approximately 10.

10. A method of operating a phase change memory cell, the method comprising:
supplying reset current at a predetermined value above a nominal reset condition to growth-dominated phase change material formed between a bottom electrode and a top electrode and surrounded by insulation material at sidewalls thereof, wherein an active volume in the phase change memory cell only includes an amorphous phase of the growth-dominated phase change material in a reset state, wherein a nominal reset condition is $I_{reset}$, and the current used for programming for high temperature operation is approximately 1.10 $I_{reset}$ or higher.

11. The method of claim 10, wherein the phase change memory cell is a pillar phase change memory cell.

12. The method of claim 10, wherein the growth-dominated phase change material comprises an alloy including at least two materials of a group of materials containing Ge, Sb, Te, In, Se, Bi, Ag, Ga, Sn, Pb, As.

13. The method of claim 10, wherein the insulation material laterally encloses the bottom electrode, the top electrode, and the growth-dominated phase change material.

14. The method of claim 13, wherein the insulation material is silicon nitride.

15. The method of claim 13, wherein the bottom electrode and the top electrode are formed of titanium nitride (TiN).

16. The method of claim 10, wherein the phase change memory cell operates at a temperature above approximately 150 degrees Celsius.

17. The method of claim 11, wherein a diameter of a pillar filled with the growth-dominated phase change material is in a range of approximately 5 nanometers (nm) to approximately 500 nanometers (nm).

18. The method of claim 17, wherein an aspect ratio of the pillar is in a range of approximately 0.5 to approximately 10.

19. A phase change memory cell comprising:
a bottom electrode;
a top electrode separated from the bottom electrode;

growth-dominated phase change material deposited between the bottom electrode and the top electrode and contacting the bottom electrode and the top electrode and surrounded by insulation material at sidewalls thereof, wherein the phase change memory cell in a reset state only includes an amorphous phase of the growth-dominated phase change material within an active volume of the phase change memory cell, and wherein the phase change memory cell comprises a current path that includes interface regions between the bottom electrode, the growth-dominated phase change material and the top electrode such that a reset current at a predetermined value above the nominal reset condition flows along the current path, and the growth-dominated phase change material is fully amorphized after the reset operation, and wherein a nominal reset condition is $I_{reset}$, and the current used for programming for high temperature operation is approximately 1.10 $I_{reset}$ or higher.

* * * * *